US007684427B2

(12) United States Patent
Kröckel

(10) Patent No.: US 7,684,427 B2
(45) Date of Patent: Mar. 23, 2010

(54) SWITCHING MATRIX WITH TWO CONTROL INPUTS AT EACH SWITCHING ELEMENT

(75) Inventor: Horst Kröckel, Bamberg (DE)

(73) Assignee: Siemens Aktiengesellschaft, Munich (DE)

( * ) Notice: Subject to any disclaimer, the term of this patent is extended or adjusted under 35 U.S.C. 154(b) by 1160 days.

(21) Appl. No.: 11/283,274

(22) Filed: Nov. 18, 2005

(65) Prior Publication Data

US 2006/0126609 A1 Jun. 15, 2006

(30) Foreign Application Priority Data

Nov. 19, 2004 (DE) ....................... 10 2004 055 939

(51) Int. Cl.

| | |
|---|---|
| ***H04L 12/40*** | (2006.01) |
| ***H03K 19/084*** | (2006.01) |
| ***H03K 10/082*** | (2006.01) |
| ***H03K 19/10*** | (2006.01) |
| ***H03K 19/00*** | (2006.01) |
| *H03K 5/22* | (2006.01) |

(52) U.S. Cl. ....................... 370/438; 326/130; 326/131; 326/132; 326/133; 326/134; 326/135; 327/63; 327/64; 327/65; 327/68; 327/69; 327/70

(58) Field of Classification Search ....................... None
See application file for complete search history.

(56) References Cited

U.S. PATENT DOCUMENTS

| | | | | |
|---|---|---|---|---|
| 3,714,374 | A * | 1/1973 | Sobel | 348/801 |
| 4,125,784 | A * | 11/1978 | Harrison | 326/14 |
| 4,959,515 | A | 9/1990 | Zavracky et al. | |
| 5,932,936 | A * | 8/1999 | Potthast et al. | 307/113 |
| 6,452,374 | B1 | 9/2002 | Kreischer | |
| 6,495,387 | B2 | 12/2002 | French | |
| 6,960,971 | B2 * | 11/2005 | Park et al. | 333/262 |
| 2003/0151480 | A1 | 8/2003 | Orr | |
| 2003/0227351 | A1 * | 12/2003 | Sievenpiper | 333/105 |
| 2004/0070400 | A1 | 4/2004 | Van Spengen | |

FOREIGN PATENT DOCUMENTS

| | | |
|---|---|---|
| DE | 37 34 822 A1 | 4/1989 |
| WO | WO 2004/047216 | 6/2004 |

OTHER PUBLICATIONS

Duewer, B.E.; Wilson, J.M.; Winick, D.A.; Franzon, P.D., MEMS-based capacitor arrays for programmable interconnect and RF applications, Proceedings of the 20th Anniversary Conference on Advanced Research in VLSI, pp. 369-377, Mar. 21-24, 1999.*

(Continued)

*Primary Examiner*—Daniel J Ryman
*Assistant Examiner*—Christopher Crutchfield
(74) *Attorney, Agent, or Firm*—Schiff Hardin LLP

(57) ABSTRACT

A switching matrix has a first number of inputs and a second number of outputs as well as a conductor arrangement and controllable switching elements by means of which the inputs can be connected with the outputs. The controllable switching elements are fashioned such that at least two independent control signals are required to trigger a switching event.

16 Claims, 2 Drawing Sheets

OTHER PUBLICATIONS

Winick, D; Duewer, B; Chaudhury, S; Wilson, J; Tucker, J; Umut, E; Frazon, P; MEMS based Diffractive Optical Beam Steering Technology, SPIE Conference Publications, vol. 2376, pp. 81-81, 1998.*

Eleftheriou, E.; Antonakopoulos, T.; Binnig, G.K.; Cherubini, G.; Despont, M.; Dholakia, A.; Durig, U.; Lantz, M.A.; Pozidis, H.; Rothuizen, H.E.; Vettiger, P., Millipede—a MEMS-based scanning-probe data-storage system, IEEE Transactions on Magnetics, vol. 39, No. 2, pp. 938-945, Mar. 2003.*

Duewer, B; A Low Power High Performance MEMS-Based Switch Fabric, PhD Thesis, North Carolina State University, pp. 1-190, 2001.*

* cited by examiner

SWITCHING MATRIX WITH TWO CONTROL INPUTS AT EACH SWITCHING ELEMENT

BACKGROUND OF THE INVENTION

1. Field of the Invention

The present invention concerns a switching matrix of the type having a first number of inputs and a second number of outputs with a conductor arrangement and controllable switching elements by means of which the inputs can be selectively connected with the outputs.

2. Description of the Prior Art

In the transmission of electrical signals, it is frequently necessary to route a number of input signals. For example, a switching matrix is necessary to route magnetic resonance signals acquired by a number of local coils to corresponding receivers. In general, all local coils are not always simultaneously located in a homogeneity volume of the magnetic resonance apparatus and thus each coil does not always receive a magnetic resonance signal. Furthermore, the number of local coils frequently exceeds the available analog/digital converters that convert the signal for further processing. It is therefore necessary to use a switching matrix so that the local coils can be variably connected with the analog/digital converters. For example, there are magnetic resonance apparatuses with 32 acquisition channels to which analog/digital converters are connected. If 64 local coils for examination of a patient are positioned in an examination, the local coils are variably connected with the 32 analog/digital converters by the switching matrix.

The switching matrix can be realized as a distributor network that is composed of conductors that lead from the local coils to the acquisition channels and are arranged in rows and columns. At each intersection point of the various lines, a controllable switch is present that can connect or separate the corresponding intersecting lines and thus connect the respective local coil with the respective analog/digital converter. In the example of 64 local coils and 32 acquisition channels, 2,048 controllable switching elements are necessary. One possibility for the realization of such a switching matrix is the use of semiconductor technology. Each switch can be formed by semiconductor components, with one to three semiconductor components being necessary for each switch. Capacitors and coils are still additionally used to separate the control signal of the switch from the radio-frequency voltage to be switched. In total, more than 10,000 individual semiconductor elements are required to realize such a switching matrix. It is additionally necessary to activate each switch in the switching element by means of a separate control line via which the control signal is supplied. A control unit is necessary for each control line for generation of the control signals. Such a high number of control units can not be realized on one chip even in customer-specific integrated circuits.

A further possibility for the realization of controllable switches is micro-electromechanical components (MEM). In particular electromechanical relays or switches are of interest for the application in the switching matrix. Because such switches close the conductors via a mechanical contact, they exhibit a good linearity in terms of their analog signal transfer performance. The use of such components, however, also requires a separate control line and a control unit.

SUMMARY OF THE INVENTION

An object of the present invention is to provide a switching matrix in which a number of controllable switching elements can be controlled with little effort.

This object is achieved by a switching matrix wherein each of the controllable switching elements has a single state-changing component that is switched by at least two independent control signals, so it is also possible to design the control lines as a matrix, thus sparing a large number of conductors. In such an arrangement each switching element is connected with two control lines. However, it only switches when a control signal is applied on both lines, and the state-changing equipment thereof changes state only when a control signal is applied on both lines. The number of control lines in the example of 64 acquisition channels and 32 local coils is thereby reduced from 2,049 to 96, which entails a drastic simplification in the manufacture of such a switching matrix.

In an embodiment, each switching element is formed by a micro-electromechanical switch. This type of switch offers the advantage of good linearity in terms of its analog signal transfer performance since such switches close the conductors via a mechanical contact.

DESCRIPTION OF THE DRAWINGS

FIG. 4 shows an alternative embodiment of the micro-electromechanical switching element.

DESCRIPTION OF THE PREFERRED EMBODIMENTS

Figure 1:
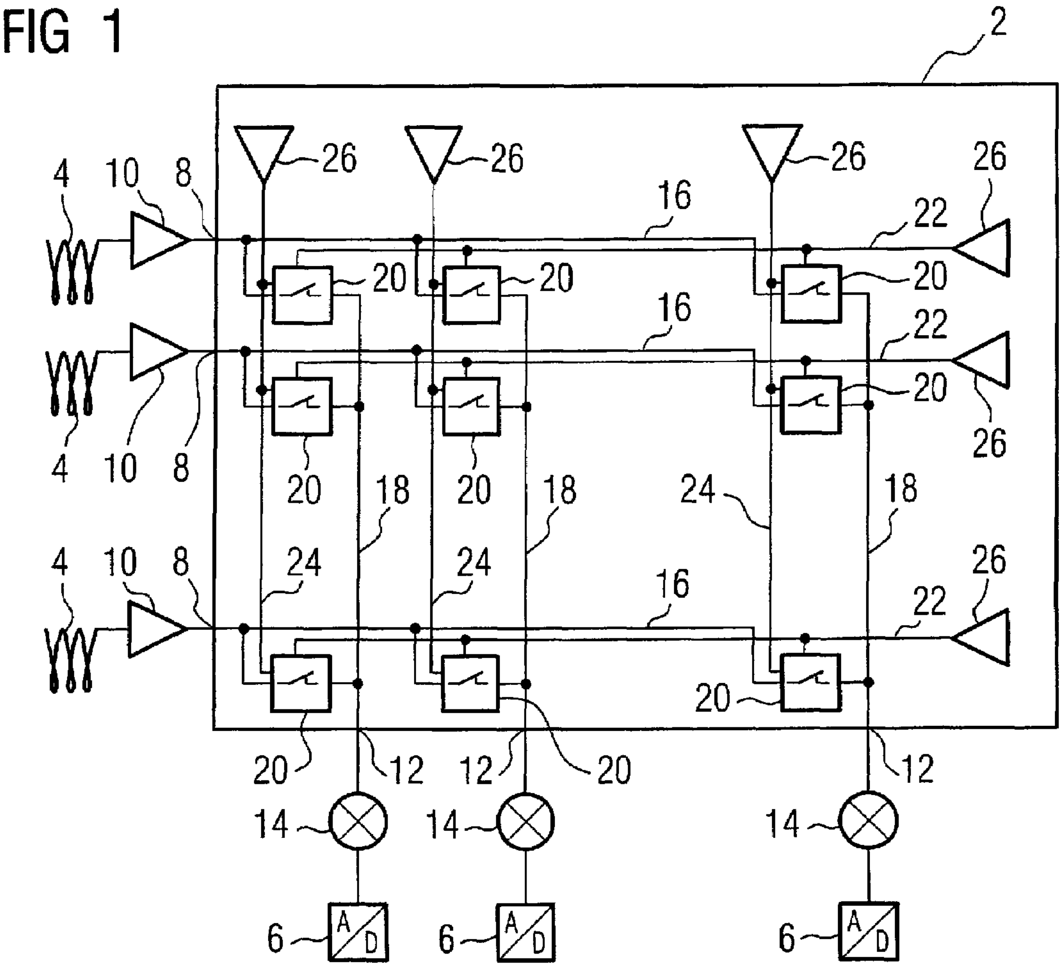
FIG. 1 is a schematic representation of a switching matrix in accordance with the invention.

FIG. 1 shows a switching matrix 2 for connection of local coils 4 of a magnetic resonance apparatus with corresponding analog/digital converters 6. Inputs 8 of the switching matrix 2 are connected with a number of local coils 4. Coil preamplifiers 10 are arranged between the switching matrix 2 and the local coils 4. Three local coils 2 and three coil preamplifiers 10 are shown in this example.

The switching matrix 2 has a number of outputs 12 that are connected with analog/digital converters 6. Only three analog/digital converters 6 are shown in this example. Mixers 14 are respectively arranged between the switching matrix 2 and the analog/digital converters 6.

The switching matrix 2 has an electrical signal line 16 and 18 for each local coil 4 to be connected and each analog/digital converter 6 to be connected. The electrical signal lines 16 and 18 are arranged in the form of a matrix. The switching matrix 2 has switching elements 20 by means of which the signal lines 16 from the local coils 4 can be connected with the signal lines 18 to the analog/digital converters 6, or can be separated therefrom. The design of the switching elements 20 is further described in detail below in connection with FIG. 2.

The switching matrix 2 has a number of electrical control lines 22 and 24 for control of the switching elements 20. The switching elements 20 are connected via the control lines 22 with control units 26 via which control signals are generated and transferred to the switching elements 20. The control units 26 are individually actuatable (activatable) dependent on which inputs 8 are desired to be connected to which outputs 12. The control lines 22 and 24 are arranged in a matrix structure analogous to the signal lines 16 and 18. All switching elements arranged in a row are thereby connected with a control unit 26 via one of the control lines 22. All switching elements 20 arranged one above the other in a column are likewise connected with a single control unit 20 via one of the control lines 24. Each of the switching elements 20 is consequently connected with two of the control units 26. In the present example, each control unit 26 is connected with three switching elements 20.

If one of the local coils 4 should be connected with one of the analog/digital converters 6, it is thus necessary to close the corresponding switching element 20. Control signals of both control units 26 connected with the respective switching element 20 are necessary for this. Corresponding control signals are also applied to the switching elements 20 arranged in the same row or, respectively, the same column, but only one control signal, which is not sufficient to trigger a switching event of the switching element 20. This is explained below in detail using FIG. 2. In comparison with a known crossover matrix in which each switching element 20 is activated via a separate control unit 26, the number of the control units 26 and control lines 22 and 24 is drastically reduced. In the exemplary switching matrix, the difference of six as opposed to nine control units 26 is small; but in general the number of the required control lines 22 and 24 and control units 26 reduces from m·n to m+n, whereby m is the number of the local coils 2 and n is the number of the analog/digital converters 6. In the example mentioned above of a magnetic resonance apparatus with sixty-four local coils and thirty-two analog/digital converters, the number of the required control units reduces from 2,048 to 96.

Figure 2:
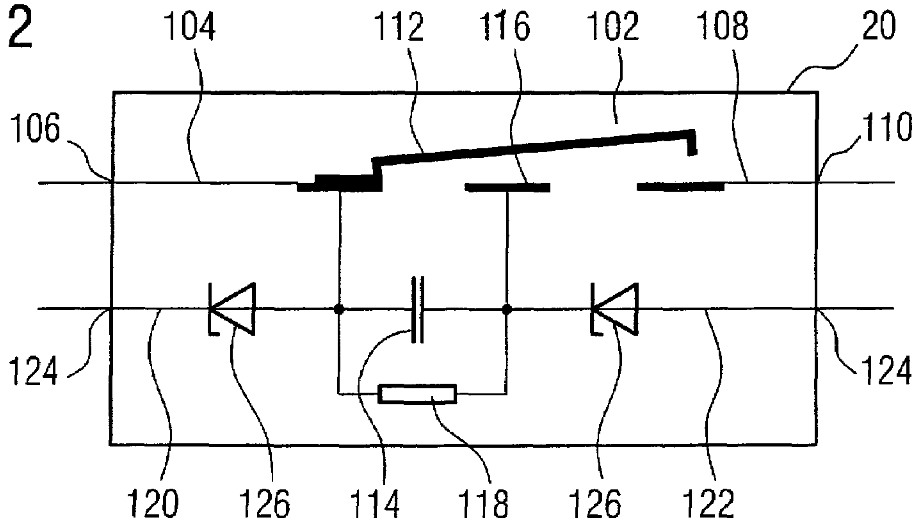
FIG. 2 is an exemplary embodiment of a micro-electromechanical switching element.

FIG. 2 shows the internal design of one of the switching elements 20. The switching element 20 has a micro-electromechanical switch 102, as the state-changing component thereof that is connected with a signal input 106 via a line 104. In the switching matrix 2, the signal input 106 is connected with one of the local coils 4 via one of the electrical signal lines 16. The switch 102 is connected with a signal output 110 of the switching element 20 over a second line 108. In the switching matrix 2, the signal output 110 is connected with one of the analog/digital converters 6 over one of the electrical signal lines 18. Given a closed switch 102, the local coil 4 is connected with the analog/digital converter 6 and transfers its measurement signals.

The switch 102 has a switch tongue 112 that is connected with a switch contact 116 via a capacitor 114. If a sufficiently high voltage is applied between the switch contact 116 and the switch tongue 112, the switch 102 is closed. The capacitor 114 is simultaneously charged. Due to the charging of the capacitor 114, even given a disconnected voltage the switch 102 is held closed for a defined time. A resistor 118 is switched in parallel with the capacitor 114 to achieve a discharge of the capacitor 114 with a definite time constant.

The capacitor 114 is connected with two control inputs 124 of the switching element 20 via two control lines 120 and 122. The control inputs 124 are connected with the control lines 22 and 24 in the switching matrix. If control signals (in the form of sufficiently high voltages) are applied at both control inputs 124, the switch 102 is closed. A Zener diode 126 is arranged in each of the control lines 120 and 122. This prevents a closing of the switch 102 in the event that a control signal is present on only one of the two control lines 120 or 122. The corresponding voltage is selected such that it is not sufficient in order to switch both Zener diodes 126 to the conductive state, i.e. to exceed the Zener voltage of the Zener diodes 126. In this case no current flows and the switch 102 is not closed. The Zener diodes 126 only switch to the low-ohmic state (whereby the switch 102 is closed) when control signals are applied at both control inputs 125. Transistors or other electronic components with comparable effect can be used instead of Zener diodes.

With the described design of the switching element 20 it is ensured that the connection from a local coil 4 to an analog/digital converter 6 is produced only when two control signals are applied to the switching element 20. Otherwise the switching element 20 remains open. In comparison with known solutions, less effort is necessary to variably route a number of input signals. The application is not limited to magnetic resonance signals; rather, the matrix can be used in other fields.

Figure 3:
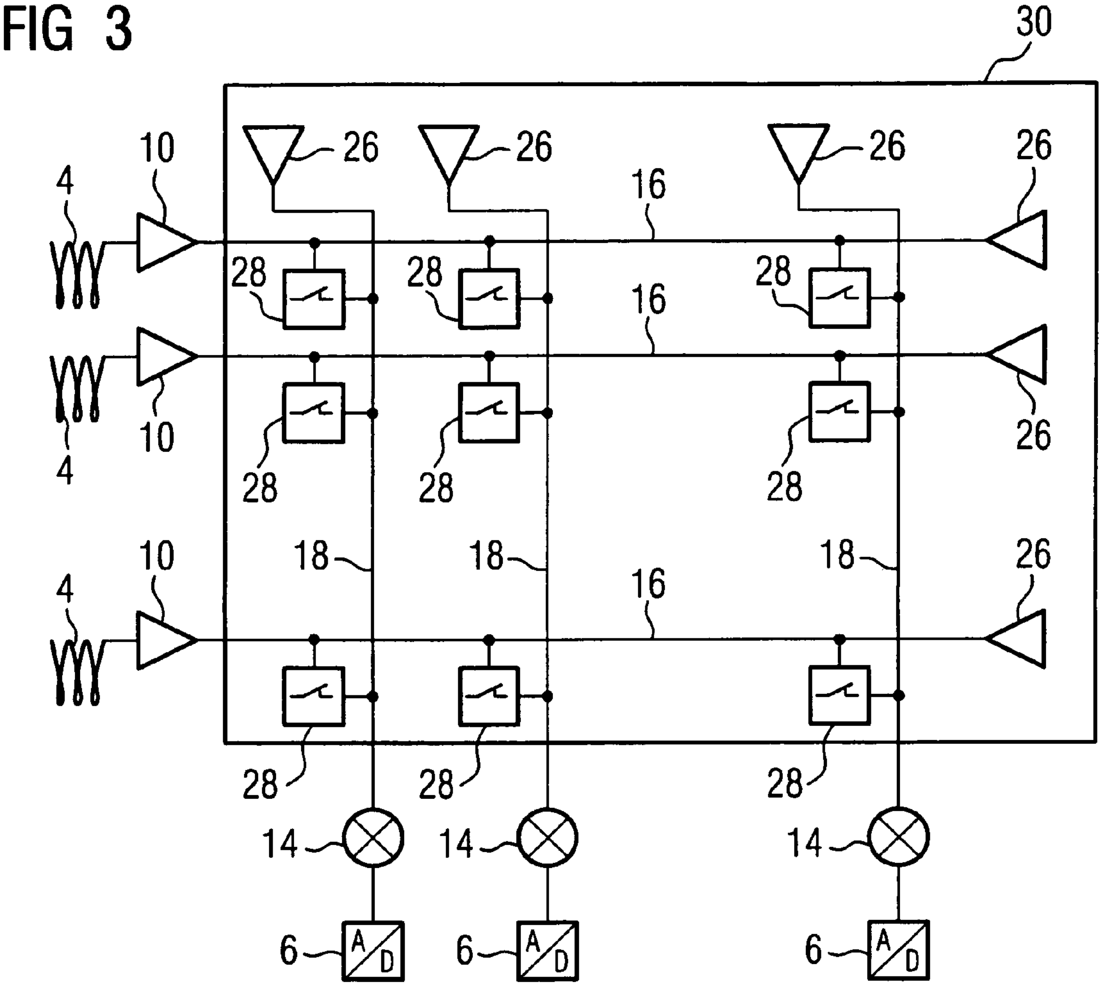
FIG. 3 shows an alternative embodiment of the inventive switching matrix.

FIG. 3 shows an alternative embodiment of the switching matrix 30. The fundamental design for the most part corresponds to the example described in FIG. 1, so only the differences are discussed. In contrast to the example shown in FIG. 1, in the exemplary embodiment from FIG. 3 no control lines 22 and 24 are provided. Instead, the control units 36 are directly connected with the switching elements 28 via the signal lines 16 and 18. The internal design of the switching elements 28 differs from the switching elements 20 shown in FIG. 1 and is described in detail using FIG. 4.

The principle functionality equates to that described in connection with FIG. 1. Only when two control signals are applied to a switching element 28 is a switching event triggered and does the switch close. The corresponding local coil 4 is then connected with the corresponding analog/digital converter 6.

FIG. 4 shows the internal design of the switching element 28 used in the switching matrix 30, wherein the design and functionality correspond to the example shown in FIG. 2, but the switching element 28 does not possess the separate control inputs 124 of the switching element 20. In the switching element 28, the signal lines 104 and 108 and the control lines 120 and 122 are merged into respective connection lines 128 and 130 just before the connections 132 and 134 of the switching element 28. The switching element 28 thus has only two connections 132 and 134, in contrast to which the switching element 20 in total has four connections 106, 110 and the two connections 24.

The conduction of the measurement signals of the local coils 4 and of the control signals of the control units 26 is unproblematic since the measurement signals to be transferred from the local coils 4 are radio-frequency signals, but the control signals are direct voltage currents. Two capacitors 136 are arranged before and after the switch tongue 102 of the switch to block the direct voltage signals from the signal path leading across the switch 102. Otherwise, the design corresponds to the arrangement already described in FIG. 2 with Zener diodes 126, holding contact 116 as well as capacitor 114 and resistor 118.

Although modifications and changes may be suggested by those skilled in the art, it is the intention of the inventor to embody within the patent warranted hereon all changes and modifications as reasonably and properly come within the scope of his contribution to the art.

I claim as my invention:

1. A switching matrix comprising:

a plurality of inputs;

a plurality of outputs;

a plurality of switching elements respectively connected between said inputs and said outputs, each switching element comprising a single state-changing component that produces a connection or disconnection, dependent on a switching state of the state-changing component, between one of said inputs and one of said outputs;

a first plurality of control units connected to one or more of said plurality of switching elements for temporarily supplying respective first control signals thereto;

a second plurality of control units connected to one or more of said plurality of switching elements for temporarily supplying respective second control signals thereto; and each of said switching elements comprising a first control signal path connected between a control unit in said first plurality of control units and connected to said state-changing component, and a second control signal path connected between a control unit in said second plurality of control units and said state-changing component, said first control signal path comprising a first control connection, connected to a first electronic component and a capacitor connected in series, and said second control signal path comprising a second control connection connected to a second electronic component;

said first and second electronic components and said capacitor in each switching element being configured to cause said state changing component to change state to produce said connection only when that switching element has been supplied with both of said first and second control signals, and to maintain said connection for a predetermined time duration after both of said first and second control signals are no longer being supplied; and said first electronic component being a first electrical blocking element connected between said capacitor and said first control connection and said second electronic component being a second electrical blocking element connected between said capacitor and said second control connection, said first and second blocking elements permitting current flow therethrough only when said first control signal is present at said first control connection, and when said second control signal is present at said second control connection.

2. A switching matrix as claimed in claim 1 further comprising a first plurality of signal lines respectively connecting said switching elements with said plurality of inputs, and a second plurality of signal lines respectively connecting said switching elements with said outputs.

3. A switching matrix as claimed in claim 2 wherein said first plurality of control units are respectively connected to said first plurality of signal lines and supply the respective first control signals to said switching elements via said first plurality of signal lines by connecting said first plurality of control units to respective first control connections using respective ones of said first plurality of signal lines;

wherein said second plurality of control units are respectively connected to said second plurality of signal lines, and respectively supply said second control signals to said switching elements via said second plurality of signal lines by connecting said second plurality of control units to respective second control connections using respective ones of said second plurality of signal lines.

4. A switching matrix as claimed in claim 2 comprising:

a first plurality of control lines respectively connecting said first plurality of control units to said first control connection of said first control signal path, said first plurality of switching elements respectively supplying said control signals to said plurality of switching elements via said first plurality of control lines, and a second plurality of control lines respectively connecting said second plurality of control units to said second control connection of said second control signal path, said second plurality of control units respectively supplying said second control signals to said plurality of switching elements via said second plurality of control lines, said first and second pluralities of control lines being separate from said first and second pluralities of signal lines.

5. A switching matrix as claimed in claim 1 wherein:

said switching elements are disposed in rows and columns, each of said rows having one of a first plurality of control lines associated therewith that is connected to all of the switching elements in that row by connecting one of the first plurality of control units to the first plurality of control connections of the switching elements in that row via said first control line, and each of said columns having one of a second plurality of control lines associated therewith that is connected to all of the switching elements in that column by connecting one of the second plurality of control units to the second plurality of control connections of the switching elements in that column via said second control line.

6. A switching matrix as claimed in claim 1 wherein said switching elements are arranged in rows and columns.

7. A switching matrix as claimed in claim 1 wherein each of said switching elements comprises a micro-electromechanical switch forming said single state-changing component thereof.

8. A switching matrix as claimed in claim 7 wherein each of said switching elements comprises:

a first connection connected to one of said plurality of inputs and one of said control units in said first plurality of control units, and a second connection connected to one of said plurality of outputs and one of said control units in said second plurality of control units, and wherein said micro-electromechanical switch comprises:

a movable switch tongue connected between said first and second connections, and a switch contact connected to each of said first and second connections respectively via said first and second control signal paths, said switch contact causing movement of said switch tongue to produce a connection or a disconnection between said first and second connections dependent on said first and second control signals at said switch contact.

9. A switching matrix as claimed in claim 8 wherein said switch contact causes said switch tongue to move to produce a connection between said first and second connections when said first and second control signals produce a defined voltage at said switch contact.

10. A switching matrix as claimed in claim 8 wherein said capacitor is a first capacitor and wherein each switching element further comprises a second capacitor connected between said switch tongue and said second connection.

11. A switching matrix as claimed in claim 7 wherein each switching element comprises:

a first signal connection to one of said plurality of inputs, a second signal connection to one of said plurality of outputs, said first and second signal connections and first and second control connections being separate from each other, and wherein said micro-electromechanical switch comprises:

a movable switch tongue connected between said first and second signal connections, and a switch contact connected to said first and second control connections respectively via said first and second control signal paths, said switch contact causing movement of said switch tongue to connect or disconnect said first and second signal connections dependent on said first and second control signals at said first and second control signal connections.

12. A switching matrix as claimed in claim 11 wherein said switch contact moves said switch tongue to produce a connection between said first and second signal connections when said first and second control signals produce a defined voltage at said switch contact.

13. A switching matrix as claimed in claim 1 wherein each switching element comprises a resistor connected in parallel with said capacitive element.

14. A switching matrix as claimed in claim 1 wherein each of said first and second blocking elements is a Zener diode.

15. A switching matrix as claimed in claim 1 wherein said plurality of outputs is fewer than said plurality of inputs.

16. A magnetic resonance apparatus comprising:

a plurality of local coils, a plurality of analog-to-digital converters a switching matrix comprising a plurality of inputs respectively connected to said local coils, a plurality of outputs respectively connected to said analog-to-digital converters, a plurality of switching elements respectively connected between said inputs and said outputs, each switching element comprising:

a single state-changing component that produces a connection or disconnection, dependent on a switching state of the state-changing component, between one of said inputs and one of said outputs, a first plurality of control units respectively connected to said plurality of switching elements for temporarily supplying respective first control signals thereto, a second plurality of control units respectively connected to said plurality of switching elements for temporarily supplying respective second control signals thereto, and each of said switching elements comprising a first control signal path connected between a control unit in said first plurality of control units and connected to said state-changing component, and a second control signal path connected between a control unit in said second plurality of control units and said state-changing component, said first control signal path comprising a first control connection, connected to a first electronic component and a capacitor connected in series, and said second control signal path comprising a second control connection connected to a second electronic component;

said first and second electronic components and said capacitor in each switching element being configured to cause said state changing component to change state to produce said connection only when that switching element has been supplied with both of said first and second control signals, and to maintain said maintain said connection for a predetermined time duration after both of said first and second control signals are no longer being supplied; and said first electronic component being a first electrical blocking element connected between said capacitor and said first control connection and said second electronic component being a second electrical blocking element connected between said capacitor and said second control connection, said first and second blocking elements permitting current flow therethrough only when said first control signal is present at said first control connection, and when said second control signal is present at said second control connection.

* * * * *